United States Patent [19]
Lange et al.

[11] Patent Number: 5,175,885
[45] Date of Patent: Dec. 29, 1992

[54] CRT UPDATE WIDEBAND DOUBLE BALANCED MIXER

[75] Inventors: Julius Lange, Sunnyvale; Timothy Halloran, Cupertino, both of Calif.

[73] Assignee: Loral Aerospace Corp., New York, N.Y.

[21] Appl. No.: 584,560

[22] Filed: Sep. 18, 1990

[51] Int. Cl.$^5$ .............................................. H04B 1/26
[52] U.S. Cl. ................................... 455/323; 455/326; 455/330; 333/26
[58] Field of Search ............... 455/323, 326, 330, 332; 333/26, 247

[56] References Cited

U.S. PATENT DOCUMENTS

| | | | |
|---|---|---|---|
| 4,468,784 | 8/1984 | Jagnow et al. | 455/326 |
| 4,675,911 | 6/1987 | Sokolov et al. | 455/332 |
| 4,994,755 | 2/1991 | Titus et al. | 455/325 |
| 5,060,298 | 10/1991 | Waugh et al. | 455/326 |

OTHER PUBLICATIONS

Pavid et al, Broadband Monolithic Single and Double Ring Active/Passive Mixers, Jun./1988, pp. 71-74.

Primary Examiner—Reinhard J. Eisenzopf
Assistant Examiner—Timothy H. Keough
Attorney, Agent, or Firm—Stuart J. Madsen; Claude A. S. Hamrick; Edward J. Radlo

[57] ABSTRACT

An improved wideband double balanced GaAs mixer is presented and includes a plurality of FETs which are operative to couple a plurality of input signals to a diode ring quad wherein the signals are mixed, producing output IF signals composing multiples of the sum and difference frequency of the alternating input signals. In a first embodiment, a first pair of FETs is coupled to an input RF signal, and a second pair of FETs is coupled to an input LO signal. The first pair of FETs is driven in phase by the RF signal, while the second pair of FETs is driven in push-pull by the LO signal. This second pair of FETs is operative to alternately switch opposite sides of the diode ring quad into a conductive state wherein the mixing of the RF and LO signals take place.

8 Claims, 5 Drawing Sheets

CRT UPDATE WIDEBAND DOUBLE BALANCED MIXER

BACKGROUND OF THE INVENTION

1. Field of the Invention

The present invention relates generally to electrical signal mixers and more particularly to a novel broadband double balanced mixer which uses active elements for frequency conversion of communication signals at microwave frequencies.

2. Brief Description of the Prior Art

Microwave mixers are normally employed in an electrical circuit to convert a high frequency signal to a lower frequency signal in order to simplify signal processing. Double balanced mixers are commonly used in communications equipment and a variety of electronic instrumentation wherever it is necessary to convert an incident signal at a first frequency into an output signal at a different frequency. This is usually done by additive or subtractive mixing wherein an output signal contains frequency components corresponding to multiples of the sum and difference of the frequencies of at least two alternating input signals.

In the prior art devices, producing the necessary frequency balance for the two alternating current input signals generally required the use of two center-tapped transformers or the use of passive baluns. Both transformers and baluns, however, require an expansive amount of circuit space and are relatively expensive. Additionally, transformers are inherently limited in frequency range, a significant drawback in most communications applications.

SUMMARY OF THE INVENTION

The present invention utilizes a combination of active elements for signal mixing, thus eliminating transformers and baluns from the mixer circuit while achieving an increased LO to RF isolation in broadband response. Additionally, the use of active elements, i.e. transistors, permits fabrication of the mixer on a single integrated circuit, making the overall device very efficient and compact.

Briefly, a plurality of FETs couple a plurality of input signals to a diode ring quad wherein the signals are mixed, producing output IF signals composing multiples of the sum and difference frequency of the alternating input signals. In a first embodiment, a first pair of FETs is coupled to an input RF signal, and a second pair of FETs is coupled to an input LO signal. The first pair of FETs is driven in phase by the RF signal, while the second pair of FETs is driven in push-pull by the LO signal. This second pair of FETs is operative to alternately switch opposite sides of the diode ring quad into a conductive state wherein the mixing of the RF and LO signals take place.

IN THE DRAWING

DETAILED DESCRIPTION OF THE PREFER

Figure 1:
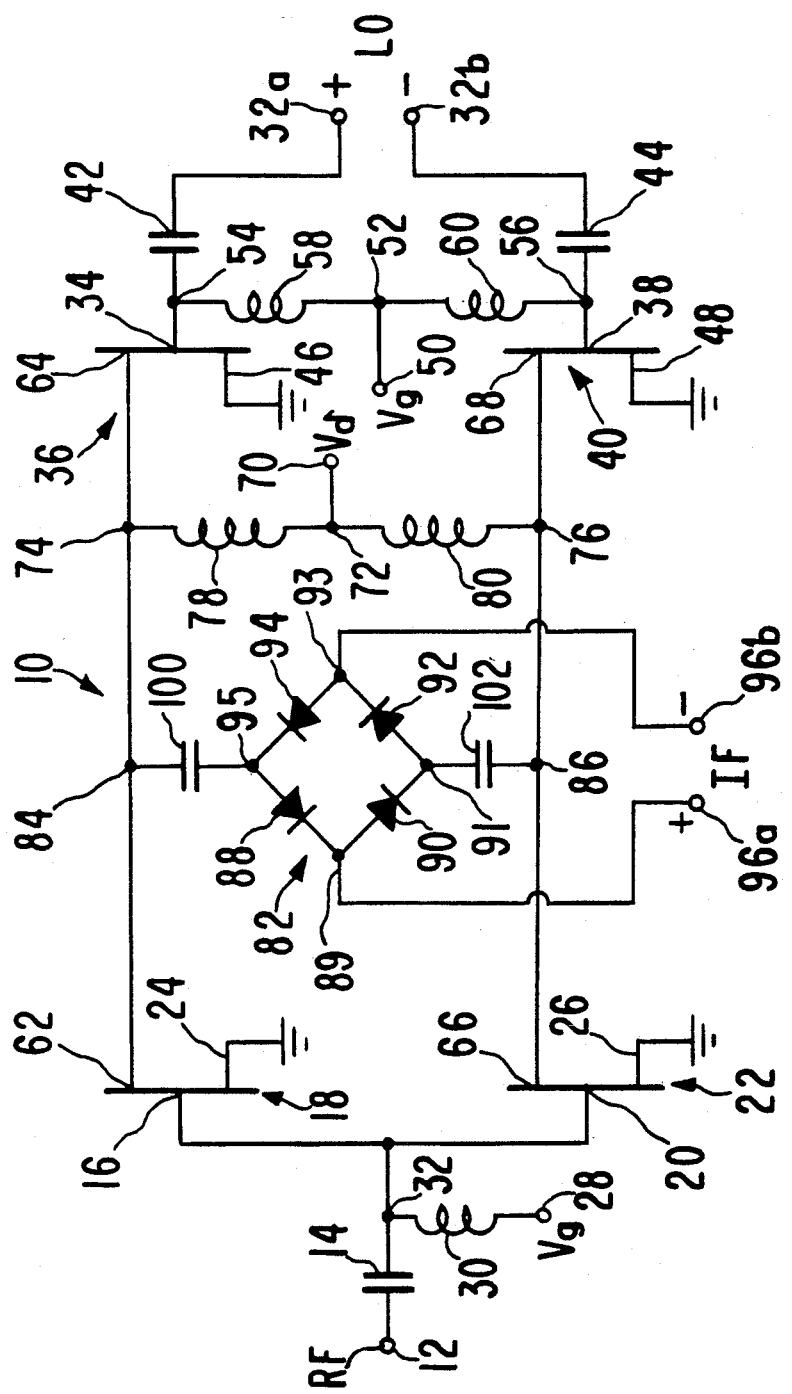
FIG. 1 is an electrical schematic illustrating a simple circuit embodiment of the present invention.

Referring now to FIG. 1, shown is a simple circuit illustrating the circuit configuration of a double balanced mixer in accordance with the preferred embodiment of the present invention. A mixer, drawn generally at 10, comprises a diode ring quad driven by four Field Effect Transistors (FETs). In the preferred embodiment, the entire mixer circuit is implemented on GaAs MMIC. A first input signal terminal 12 is coupled through a capacitor 14 to the base 16 of a FET 18 and the base 20 of a FET 22. Capacitor 14 acts to block any DC current induced by a first signal, usually on RF input signal, at terminal 12. FETs 18 and 22 are substantially identical in operation and are coupled to terminal 12 such that each FET receives a substantially identical RF signal at its respective base. The source 24 of FET 18 and the source 26 of FET 22 are both connected to common ground. A biasing potential $V_g$ is coupled through a terminal 28 and an inductor 30 to a junction 32 located between capacitor 14 and FET bases 16 and 20. Potential $V_g$ is operative to bias the gate voltages of FETs 18 and 22 to normal operational levels.

A second input signal, usually an LO signal, is coupled through a terminal 32a and a capacitor 42 to the base 34 of a FET 36, and also through a terminal 32b and a capacitor 44 to the base 38 of a FET 40. The second input signal is inverted at one terminal with respect to the other. That is, when the signal at terminal 32a is positive, the signal at 32b is negative, and vice versa. This terminal arrangement causes one of the FETs 36 or 40 to conduct while the other remains non-conductive, as further described below. The source 46 of FET 36 and the source 48 of FET 40 are both connected to common ground. The drain 62 of FET 18 is coupled to the drain 64 of FET 36, and the drain 66 of FET 22 is coupled to the drain 68 of FET 40.

A biasing potential $V_g$ is coupled through a terminal 50 and a junction 52 to a junction 54 between capacitor 42 and base 34, and further to a junction 56 between capacitor 44 and base 38. An inductor 58 is coupled between junction 52 and junction 54, and an inductor 60 is coupled between junction 52 and junction 56. Potential $V_g$ is operative to bias the gate voltages of FETs 36 and 40 to normal operational levels.

A circuit voltage source $V_d$ is coupled through a terminal 70 and a junction 72 to a junction 74 between drain 62 and drain 64. Likewise, voltage source $V_d$ is coupled through terminal 70 and junction 72 to a junction 76 between drain 66 and drain 68. An inductor 78 is coupled between junctions 72 and 74, and an inductor 80 is coupled between junction 72 and 76. Voltage source $V_d$ provides a driving potential for circuit 10.

A diode ring quad, indicated generally at 82, is coupled to a junction 84 between junction 74 and drain 62, and to a junction 86 between junction 76 and drain 66. Diode ring quad 82 includes four substantially similar diodes 88, 90, 92 and 94. Diodes 88 and 90 are coupled together in series and are coupled in parallel with diodes 92 and 94 which are also coupled in series. A junction 89 between diodes 88 and 90 is coupled to a fourth signal terminal 96 and a junction 93 between diodes 92 and 94 is coupled to a fifth signal terminal 96b. Terminals 96a and 96b normally function as an IF port for device 10. A capacitor 100 is coupled between a junction 95, located between diodes 94 and 88, and junction 84, and a capacitor 102 is coupled between a junction 91, located between diodes 90 and 92, and junction 86. Capacitors 42 and 44 act to block any DC current induced by the LO signal at terminals 32a and 32b, respectively.

In operation, FETs 18 and 22 are driven in phase by an RF input signal, and FETs 36 and 40 are driven in push-pull by the LO signal. Generally, the LO drive signal switches FETs 36 and 40 on and off alternately, thereby effectively steering the RF signal to the two terminals of the IF output, terminals 96A and 96B, thus producing the mixing action.

More specifically, when the polarity of the LO signal is as shown in FIG. 1 (terminal 32a is positive and terminal 32b is negative), FET 36 is in a conductive state while FET 40 is "off". Due to the potentials created at junctions 84 and 86 (caused by the conductive and nonconductive states of FETs 36 and 40, respectively), diodes 92 and 94 are forward-biased in a low resistance state thereby representing a closed switch condition while diodes 88 and 90 are reverse-biased to a high resistance state to define an open-switch condition. This condition operates to steer the RF signal current through diodes 92 and 94 of quad 82.

When the polarity of the LO signal is reversed in comparison to that as shown in FIG. 1 (terminal 32a is now negative and terminal 32b is now positive), FET 40 is in a conductive state and FET 36 is effectively turned "off". Due to the potentials created at junctions 84 and 86 (once again caused by the conductive and nonconductive states of FET 40 and FET 36, respectively), diodes 88 and 90 are forward-biased to a low resistance state thereby representing a closed switch condition while diodes 92 and 94 are reverse-biased to a high resistance state to define an open switch condition. This condition operates to steer the RF signal current through diodes 88 and 90 of quad 82. This steering action of the RF signal alternately to the two halves of diode ring quad 82, and thus the two terminals 96a and 96b of the IF output, produces the mixing action of circuit 10.

The high output impedance of the FETs reduces the loading of the RF drive by the LO drive and vice versa, greatly increasing the bandwidth of circuit 10. The high reverse isolation of the FETs and the inherent balance of the circuit, due to the fact that the RF is in phase and the LO is in push-pull, result in a very high isolation between the RF and LO inputs. Since there is no need for transformers or an RF balun, the circuit lends itself very well to an implementation on a GaAs MMIC in a very small area.

Figure 2:
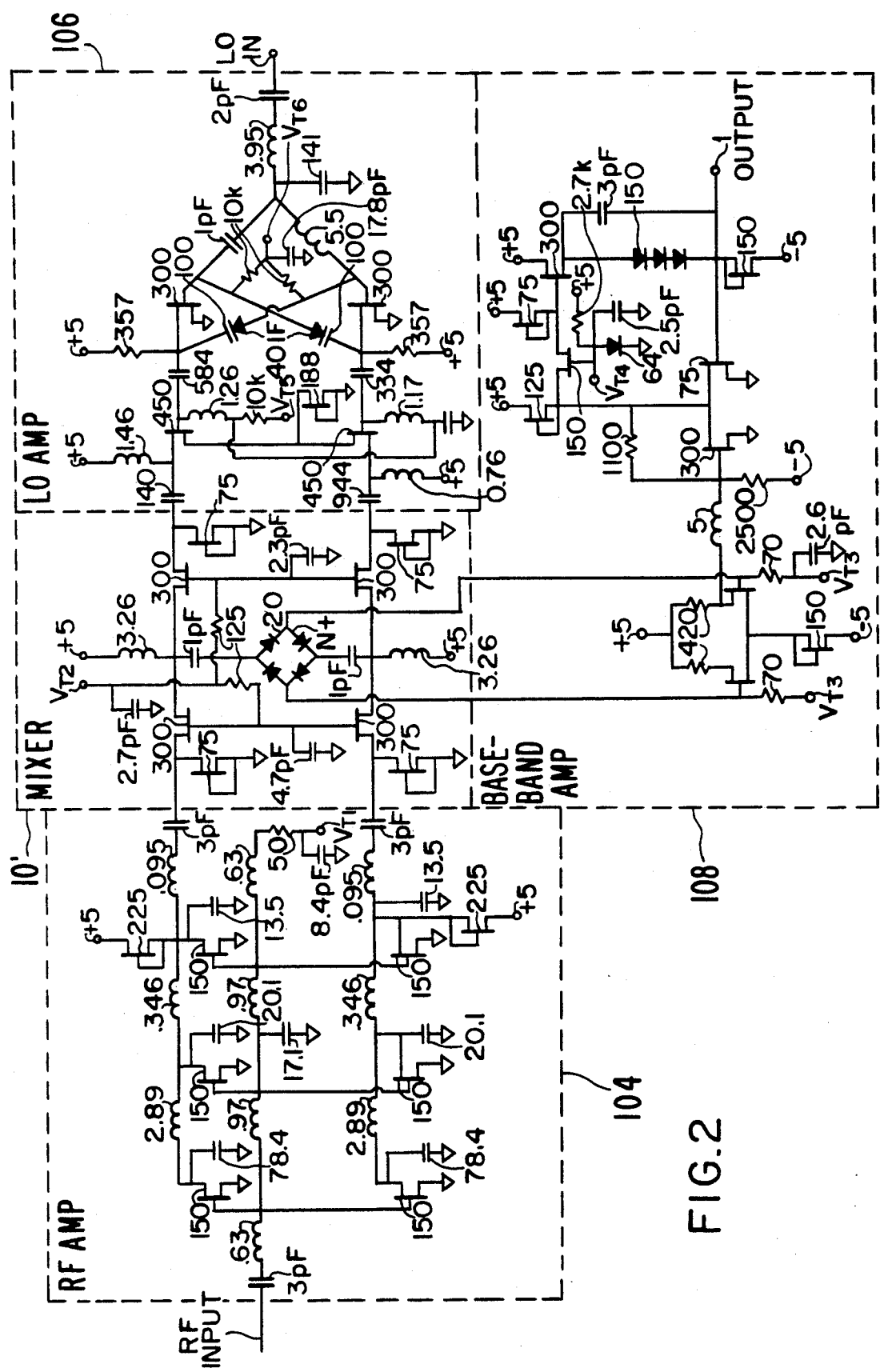
FIG. 2 is an electrical schematic illustrating the present invention in its operational embodiment connected to various amplification means.

Referring now to FIG. 2, shown is an expanded operational version of the preferred embodiment a modified mixer circuit 10', a distributed amplifier 104, an LO amplifier 106 with a built-in lumped element balun, and an IF amplifier 108 with push-pull input and single-ended output. Each of the amplifiers 104, 106 and 108 is operative to amplify an incident signal at a predetermined gain level to facilitate proper circuit operation and signal processing. Although shown in detail in FIG. 2, the operation of amplifiers 104, 106 and 108 will not be described in detail, the focus of the circuit of the present invention being the signal mixer, 10' in FIG. 2. It is, however, important to note that this entire expanded circuit version, in accordance with the preferred embodiment, can also be completely implemented in GaAs MMIC. Thus, the full circuit as shown in FIG. 2 also lends itself very well to complete implementation in a very small area.

Figure 3:
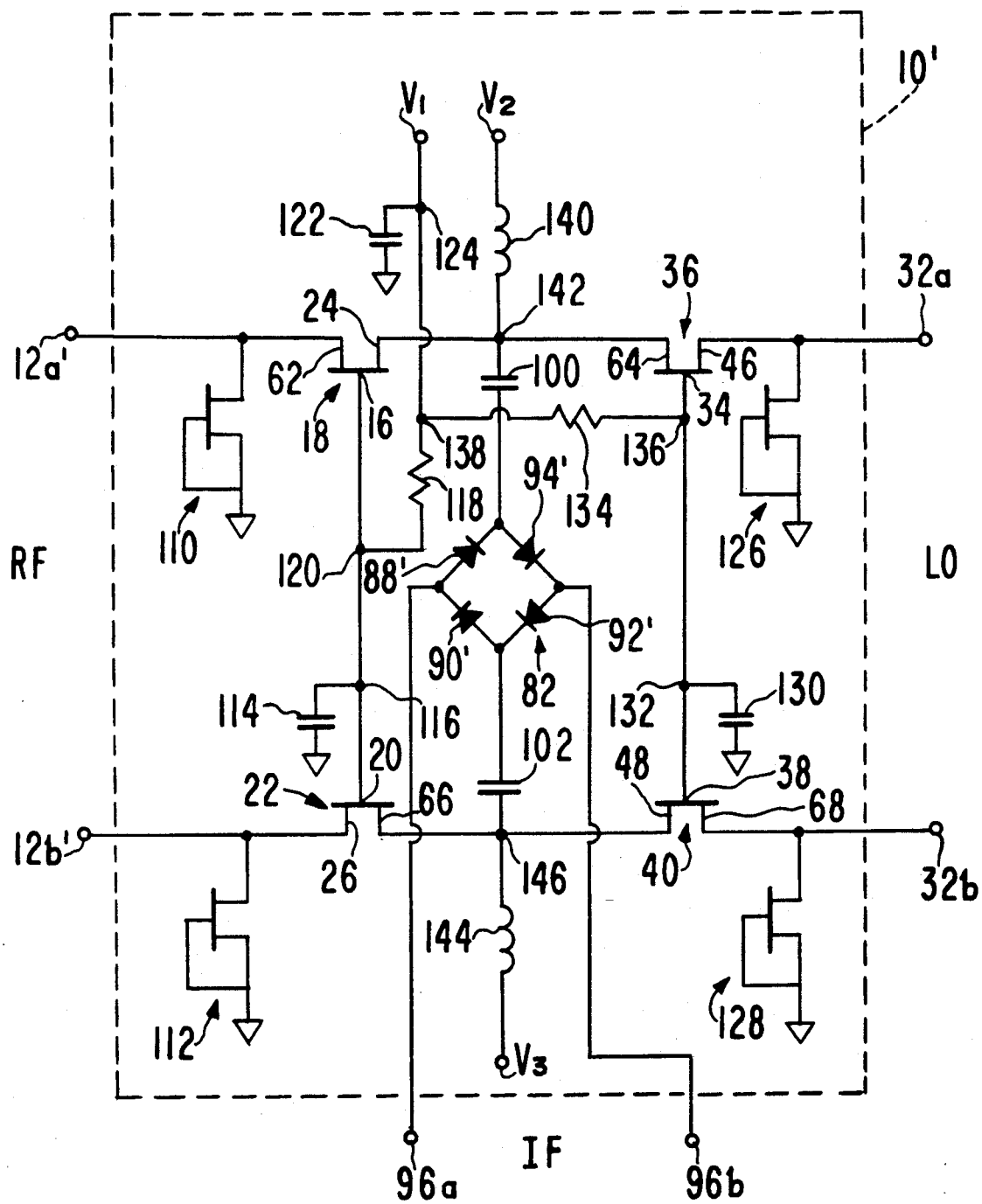
FIG. 3 is an electrical schematic illustrating an isolated view of the broadband mixer of the present invention shown in FIG. 2.

Referring now to FIG. 3, an isolated view of mixer element 10' is shown in detail. Mixer 10 and mixer 10' are substantially the same in both electrical component types and in operation. As is shown, an RF signal is coupled in phase to signal terminals 12a and 12b. The source 62 of FET 18 is coupled to terminal 12a and has its gate 16 connected to gate 20 of FET 22. The source 26 of FET 22 is coupled to terminal 12b. A self-biasing FET 110 is coupled between the source 62 of FET 18 and terminal 12a, and a self-biasing FET 112 is coupled between the source 26 of FET 22 and terminal 12b. A capacitor 114 is coupled on one side to a junction 116 between gates 16 and 20, and is coupled on its other side to ground. A voltage $V_1$ is coupled through a resistor 118 to a junction 120 between gate 16 and junction 116. A capacitor 122 is coupled between ground and a junction 124 between $V_1$ and resistor 118.

LO signal terminal 32a is coupled to the source 46 of FET 36, and LO signal terminal 32b is coupled to the source 68 of FET 40. A self-biasing FET 126 is coupled between terminal 32a and source 46, and a self-biasing FET 128 is coupled between terminal 32b and source 68. The drain 64 of FET 36 is coupled to the drain 24 of FET 18. Similarly, the drain 48 of FET 40 is coupled to the drain 66 of FET 22. Gate 34 of FET 36 is coupled to gate 38 of FET 40, and a capacitor 130 is coupled between ground and a junction 132 between gates 34 and 38. A resistor 134 has one end coupled to a junction 136 between gate 34 and junction 132 and its other end coupled to a junction 138 between resistor 118 and junction 124.

A voltage $V_2$ is coupled through an inductor 140 to a junction 142 between drain 24 and drain 64. A voltage $V_3$ is coupled through an inductor 144 to a junction 146 between drain 48 and drain 66. Diode ring quad 82, including a plurality of diodes 88', 90', 92' and 94', is coupled to junctions 142 and 146 via capacitors 100 and 102, respectively. IF signal terminal 96a is coupled to diode ring quad 82 at a junction between diodes 88' and 90', and IF signal terminal 96b is coupled to diode ring quad 82 at a junction between diodes 92' and 94'.

In operation, voltage $V_1$ functions as a biasing potential source for gates 16, 20, 34, and 38 and is operative to bias the gate voltages (in conjunction with resistors 118 and 134) to normal operational levels. Voltages $V_2$ and $V_3$ supply the mixer 10' with operating potential similar to the operating potential provided by voltage $V_d$ to mixer 10 as shown in FIG. 1. Once again, as described in relation to circuit 10 of FIG. 1, in normal operation an RF input signal is mixed with an LO input signal in diode ring quad 82, and a signal at an intermediate frequency is output at IF terminals 96a and 96b.

Figure 4:
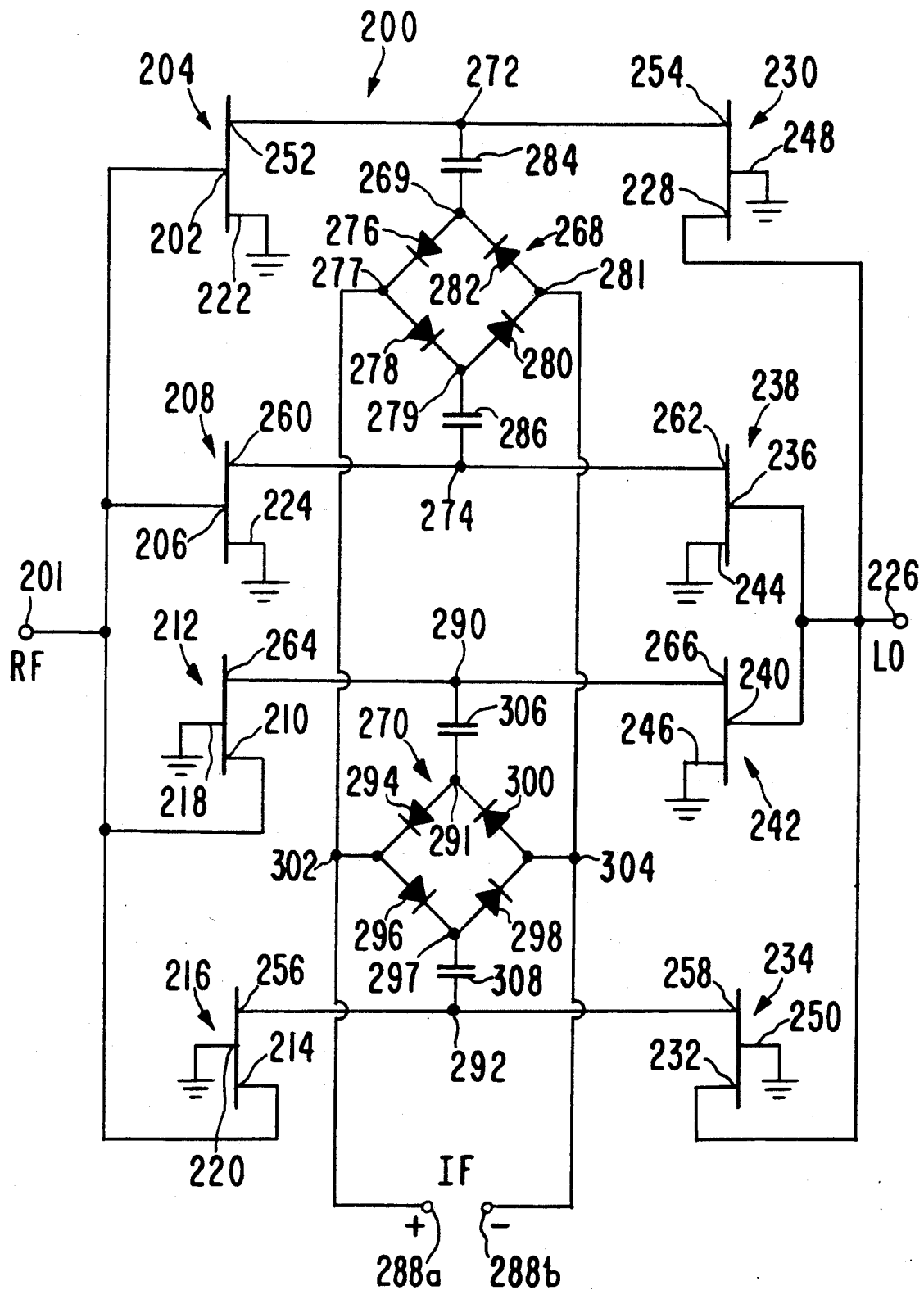
FIG. 4 is an electrical schematic illustrating a double-double balanced mixer using active baluns in accordance with the present invention.

Referring now to FIG. 4, shown is a double-double balanced mixer 200 in accordance with the present invention. As can be seen by comparison of FIGS. 1 and 4, the double-double balanced mixer 200 of FIG. 4 is similar to two stacked mixers 10 of the type shown in FIG. 1.

An RF signal terminal 201 is coupled to the gate 202 of a FET 204, and further coupled to the gate 206 of a FET 208. RF signal terminal 201 is also coupled to the source 210 of a FET 212 and the source 214 of a FET 216. The gate 218 of FET 212 and the gate 220 of FET 216 are both connected to common ground. The source 222 of FET 204 and the source 224 of FET 208 are also connected to common ground.

An LO signal terminal 226 is coupled to the source 228 of the FET 230 and further coupled to the source 232 of the FET 234. LO signal terminal 226 is also coupled to the gate 236 of a FET 238 and the gate 240 of a FET 242. The source 244 of FET 238 and the source 246 of FET 242 are both connected to common ground. The gate 248 of FET 230 and gate 250 of FET 234 are also connected to common ground. The drain 254 of FET 230 is coupled to the drain 252 of FET 204 and, similarly, the drain 258 of FET 234 is coupled to the drain 256 of FET 216. Additionally, the drain 262 of FET 238 is coupled to the drain 260 of FET 208, and the drain 266 of FET 242 is coupled to the drain 264 of FET 212.

There are two diode ring quads 268 and 270 in mixer 200 as shown in FIG. 4. Diode ring quad 268 is coupled to a junction 272 between drains 252 and 254, and further coupled to a junction 274 between drains 260 and 262. Diode ring quad 268 includes individual diodes 276, 278, 280 and 282. A capacitor 284 is coupled between a junction 269, located between diodes 276 and 268 and junction 272. A capacitor 286 is coupled between a junction 279, located between diodes 278 and 280, and junction 274. IF signal terminal 288a is coupled to diode ring quad 268 at a junction 277 between diodes 276 and 278. IF signal terminal 288b is coupled to diode ring quad 268 at a junction 281 between diodes 280 and 282.

Diode ring quad 270 is coupled to a junction 290 between drain 264 and drain 266, and further coupled to a junction 292 between drains 256 and 258. Diode ring quad 270 includes individual diodes 294, 296, 298 and 300. A capacitor 306 is coupled between junction 290 and a junction 291 between diodes 294 and 300, and a capacitor 308 is coupled between junction 292 and a junction 297 between diodes 296 and 298. Diode ring quad 270 is coupled to a junction 302 between IF signal terminal 288a and junction 277, and further coupled to a junction 304 between IF signal terminal 288b and junction 281.

In the embodiment illustrated in FIG. 4, it is important to note that double-double balanced mixer 200 uses an active balun configuration. That is, FET 204 and FET 216 function in combination as an active balun, as do FETs 208 and 212 in combination. Likewise, FETs 230 and 238 conjunctively function as an active balun, as do FETs 242 and 234 in combination. This configuration provides a high level of balance and extremely high level of signal isolation between the various terminals of mixer 200. Additionally, because only active devices are used in the fabrication of the circuit, the size of the circuit is minimized while the operational band-width is maximized.

Figure 5:
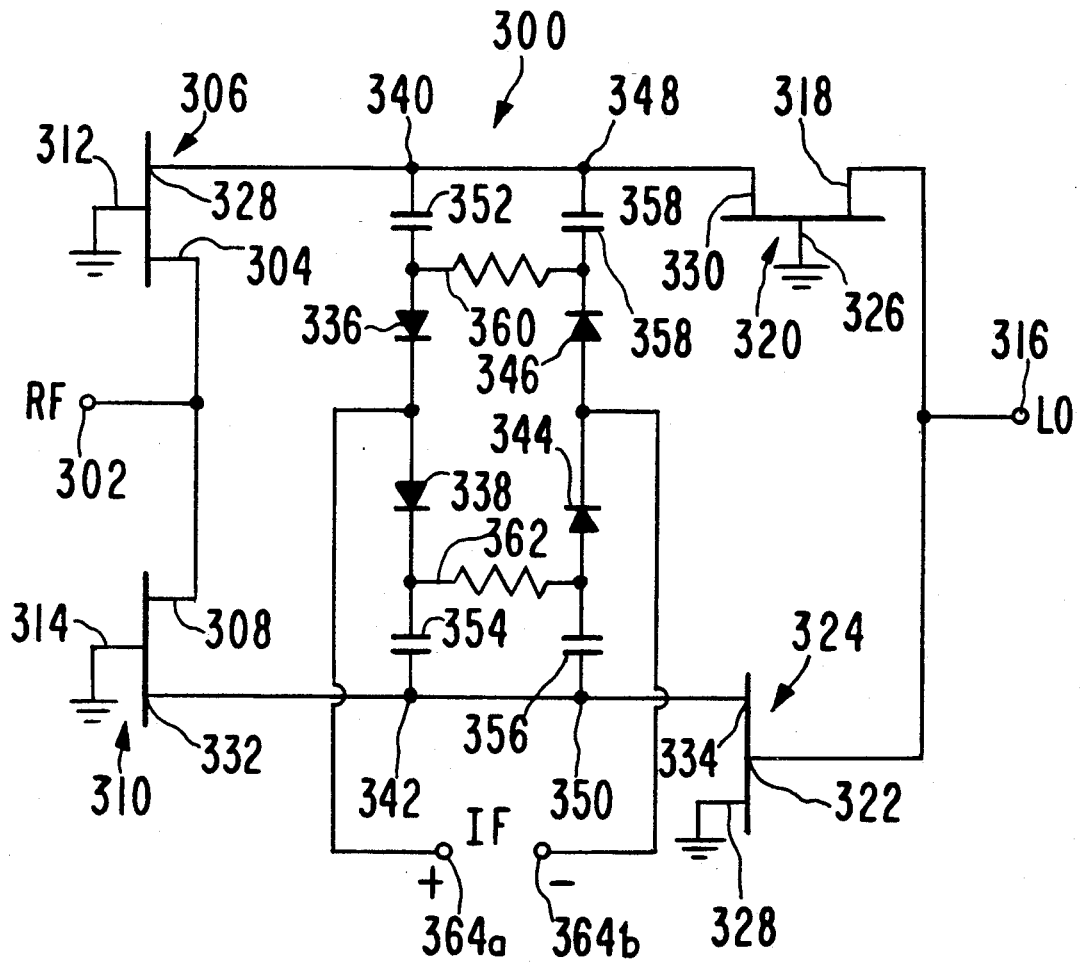
FIG. 5 is an electrical schematic of an alternative embodiment of the circuit of the present invention illustrating a high level self-biasing mixer.

Referring now to FIG. 5, shown is an electrical schematic of a high level self-biasing mixer 300 in accordance with the present invention. As can be seen, the circuit of FIG. 5 is a design derivative of mixer circuit 10 shown in FIG. 1. An RF signal terminal 302 is coupled to the source 304 of a FET 306 and the source 308 of a FET 310. The gate 312 of FET 306 and the gate 314 of FET 310 are both coupled to common ground.

An LO signal terminal 316 is coupled to the source 318 of a FET 320 and to the gate 322 of a FET 324. The gate 326 of FET 320 and the source 328 of FET 324 are coupled to common ground. The drain 330 of FET 320 is coupled to the drain 328 of FET 306, and the drain 334 of FET 324 is coupled to the drain 332 of FET 310.

A pair of diodes 336 and 338 are connected in series and are coupled to a junction 340 between drain 328 and drain 330, and further coupled to a junction 342 between drain 332 and drain 334. In a similar manner, a pair of diodes 344 and 346 are connected in series and are coupled to a junction 348 between junction 340 and drain 330, and further coupled to a junction 350 between junction 342 and drain 334. A capacitor 352 is coupled between junction 340 and diode 336, and, likewise, a capacitor 354 is coupled between junction 342 and diode 338. In a similar manner, a capacitor 356 is coupled between junction 350 and diode 344 and a capacitor 358 is coupled between junction 348 and diode 346. A resistor 360 is coupled between capacitor 352 and diode 336, and further coupled between capacitor 358 and diode 346. Likewise, a resistor 362 is coupled between capacitor 354 and diode 338, and further coupled between capacitor 356 and diode 344. An IF signal terminal 364a is coupled between diodes 336 and 338, and an IF signal terminal 364b is coupled between diodes 344 and 346.

Although the operation of circuit 300 as shown in FIG. 5 is similar to that of circuit 10 shown in FIG. 1, circuit 300 is a self-biasing mixer, normally used with large RF and LO inputs when a high third order intercept point is required. The circulating DC current induced by the LO drive creates a voltage across resistors 360 and 362 which in turn back-biases the diodes.

It is important to note that the specific interconnections of the various active elements used in the design of the circuits of the present invention as shown in the various figures are not integral to the overall function of the invention. For example, circuit 10 as illustrated in FIG. 1 could employ a common gate configuration while still achieving the same high degree of isolation between input signals and the requisite mixing action to produce sum or difference signals of the RF input signal and LO input signal. Additionally, although FETs have been chosen for implementation of the preferred embodiment, alternative active devices which exhibit high output impedance could also be substituted while achieving the same overall circuit function and signal isolation.

While there has been shown and described what are considered preferred embodiments of the present invention, it will be obvious to those skilled in the art that various changes and modifications may be made therein without departing from the invention as defined by the appended claims. Therefore, it is understood that the present disclosure by way of example and that changes in details of structure may be made without departing from the spirit thereof.

What is claimed is:

1. A wideband double balanced GaAs monolithic microwave integrated circuit (MMIC) for mixing two input signals at two frequencies to produce signals at a third frequency corresponding to the sum and difference of the two input frequencies, said circuit comprising:

mixing means, including first and second signal input means and signal output means;

said first signal input means comprising a first pair of FETs each having an electrode coupled to a first input terminal for coupling a first input signal at a first frequency from said first input terminal to said mixing means;

said second signal input means comprising a second pair of FETs each having an electrode coupled to a second input terminal for coupling a second input signal at a second frequency from said second input terminal to said mixing means;

said first and second signal input means providing a high level of electrical isolation between said first and second input terminals;

said mixing means comprising a diode ring quad having an output of one FET from each of said first and second pairs of FETs coupled to a first diode junction, having an output of the other FET from each of said first and second pairs of FETs coupled to a second diode junction diagonally opposite said first diode junction;

said circuit further comprising output means derived from additional diode junctions of said diode ring quad;

said mixing means being operative to mix said first and second input signals to produce an output signal at said output means.

2. A mixer as described in claim 1 wherein said first pair of FETs are driven in phase by a radio frequency source coupled to said first input terminal, and said second pair of FETs are driven in push-pull by a local oscillator source coupled to said second input terminal.

3. A mixer as described in claim 2 wherein said first and second pairs of FETs are coupled as common source amplifiers, said first pair of FETs each having a gate electrode coupled to said first input terminal, and said second pair of FETs each having a gate electrode coupled in push-pull to said second input terminal;

wherein one FET from each of said first and second pairs of FETs has a drain coupled to said first diode junction, and the other FET from each of said first and second pairs of FETs has a drain coupled to said second diode junction.

4. A mixer as described in claim 2 wherein the sources of said first pair of FETs are coupled in phase to said first input terminal, and the sources of said second pair of FETs are coupled in push-pull to said second input terminal; and the gates of said first and second pairs of FETs are coupled to a voltage source.

5. A mixer as described in claim 2, wherein said second input means comprises an active balun.

6. A high level wideband self-biasing GaAs monolithic microwave integrated circuit for mixing large amplitude input signals at two frequencies to produce signals at a third frequency corresponding to sum and difference frequencies of the two input frequencies, said circuit comprising:

mixing means, including first and second signal input means and signal output means;

said first signal input means comprising a first pair of FETs each having a source electrode coupled to a first input terminal and each having a grounded gate electrode;

said second signal input means comprising a second pair of FETs configured as an active balun, each FET of the second pair having a drain electrode coupled to the drain electrode of one FET of said first pair of FETs to form top and bottom drain junctions, and further, each FET of said second pair of FETs having one of its remaining electrodes coupled to a second input terminal;

said first and second signal input means being effective to couple each of said first and second input signals to said top and bottom drain junctions while providing a high level of electrical isolation between said first and second input terminals;

said mixing means comprising first and second diode chains, output means, and back-biasing means;

said first and second diode chains each comprising a first capacitor, first and second diodes, and a second capacitor, the preceding four items coupled in series between said top and bottom drain junctions, said first and second diode chains being operative to conduct current in opposite directions;

said output means comprising a junction between said first and second diodes in said first and second diode chains;

said back-biasing means comprising resistors coupled between said first and second diode chains such that a DC current induced by said second input signal is effective to create a voltage across said first and second diode chains which back-biases said diodes; wherein said mixing means mixes said first and second input signals to produce an output signal at said output means.

7. The mixer circuit as described in claim 6, wherein said back-biasing means comprises first and second resistors;

said first resistor coupling a junction between the first capacitor and the first diode of the first diode chain to a junction between the second diode and the second capacitor of the second diode chain;

said second resistor coupling a junction between the second capacitor and the second diode of the first diode chain to a junction between the first capacitor and the first diode of the second diode chain.

8. A mixer circuit as described in claim 6, wherein said first input signal is a radio frequency (RF) signal and said second input signal is a local oscillator (LO) signal.

* * * * *